(12) United States Patent
Hsu et al.

(10) Patent No.: US 8,014,149 B2
(45) Date of Patent: Sep. 6, 2011

(54) FAN MODULE FOR ELECTRONIC DEVICE

(75) Inventors: Ifeng Hsu, Taipei (TW); Jenq-Haur Pan, Taipei (TW); Chang-Yuan Wu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 12/607,957

(22) Filed: Jan. 19, 2010

(65) Prior Publication Data
US 2010/0128435 A1 May 27, 2010

Related U.S. Application Data

(60) Provisional application No. 61/118,471, filed on Nov. 27, 2008.

(51) Int. Cl.
*H05K 7/20* (2006.01)

(52) U.S. Cl. .......... 361/695; 361/679.48; 361/694; 361/719; 165/121; 165/122; 415/203; 415/206; 416/210 R; 417/423.3; 417/423.7; 417/423.14

(58) Field of Classification Search .......... 361/679.46, 361/679.48, 679.49, 690–697, 688, 689, 361/831; 165/80.3, 104.32, 104.33, 104.34, 165/121, 122, 126, 185; 454/184; 415/93, 415/182, 185, 210 R, 226, 234, 235, 203, 415/206; 416/210 R, 235; 417/18, 423.3, 417/427.7, 423.17
See application file for complete search history.

(56) References Cited

U.S. PATENT DOCUMENTS

| | | | | |
|---|---|---|---|---|
| 4,128,364 A * | 12/1978 | Papst et al. | ...................... | 417/354 |
| 5,176,509 A * | 1/1993 | Schmider et al. | .......... | 417/423.7 |
| 5,343,104 A * | 8/1994 | Takahashi et al. | .............. | 310/90 |
| 5,615,998 A * | 4/1997 | Kodama et al. | ............... | 415/177 |
| 6,013,966 A * | 1/2000 | Fehrenbacher et al. | ...... | 310/257 |
| 6,107,708 A * | 8/2000 | Yamaguchi et al. | ............ | 310/58 |
| 6,400,053 B1 * | 6/2002 | Horng | ............................ | 310/91 |
| 6,509,704 B1 * | 1/2003 | Brown | ..................... | 318/400.41 |
| 7,063,510 B2 * | 6/2006 | Takeshita et al. | .......... | 416/210 R |
| 7,207,774 B2 * | 4/2007 | Kashiwazaki et al. | ......... | 415/206 |
| 7,352,094 B2 * | 4/2008 | Winkler | .......................... | 310/89 |
| 2005/0106046 A1 * | 5/2005 | Winkler | ..................... | 417/423.3 |
| 2008/0219838 A1 * | 9/2008 | Kusano | .......................... | 415/203 |

FOREIGN PATENT DOCUMENTS

JP 11351197 A * 12/1999
* cited by examiner

*Primary Examiner* — Michael V Datskovskiy
(74) *Attorney, Agent, or Firm* — Jianq Chyun IP Office

(57) ABSTRACT

A fan module is disposed in an electrical device. The electrical device has a main board and a casing. The fan module includes a vane module, a fan motor, a circuit board and a fan housing. The vane module has a hub and a plurality of vanes disposed around the edge of the hub. The fan motor is disposed in the hub. The circuit board is used to control the fan motor, so that the vanes rotate related to an axis of the hub for generating an air flow. The fan housing has a main body portion, a protruding portion and a fixing portion, wherein the protruding portion is located in a side of the main body portion, the vane module and the fan motor are disposed in the main body portion and the circuit board is disposed in the protruding portion.

16 Claims, 4 Drawing Sheets

FAN MODULE FOR ELECTRONIC DEVICE

CROSS-REFERENCE TO RELATED APPLICATION

This application claims the priority benefit of U.S. provisional application Ser. No. 61/118,471 filed on Nov. 27, 2008. The entirety of the above-mentioned patent application is hereby incorporated by reference herein and made a part of specification.

BACKGROUND OF THE INVENTION

1. Field of the Invention

The present invention generally relates to a fan module for an electronic device, in particular, to a fan module for enhancing thermal efficiency of the electronic device.

2. Description of Related Art

In order to meet requirements of rapid velocity, high performance and light, thin, short and small of current electronic products, each kind of portable electronic devices has become more popular. Most popular portable electronic devices, such as notebook PCs, mobile phones, Personal Digital Assistants (PDAs), pocket PCs and Tablet PCs etc. As for notebook PCs, since it can not provide a large space for receiving a heat dissipation system, one of critical point to be paid attention is how to enhance the thermal efficiency of the notebook PC in such limited space. Generally speaking, the notebook PC is equipped with a fan module for dissipating heat from the heat-generating device in the interior of the notebook PC. When the fan module operates, the air with high temperature in the interior of the notebook PC passes through an air inlet to enter the fan housing of the fan module and escape through an air outlet to dissipate heat out of the notebook PC, thereby cooling down the internal temperature of the notebook PC.

FIG. 1 illustrates a schematic view of a conventional fan module. FIG. 2 illustrates a schematic view of another conventional fan module. Referring to the FIG. 1 and FIG. 2, the fan module 100 is disposed underneath a mother board 10 of an electronic device or on top of a casing 20 of the electronic device, while the dimension of the fan module 100 is restricted by the limited space between the mother board 10 and the casing 20 of the electronic device, incapable of receiving a bigger size of fan module. Thereby, the maximum height of the fan housing 110 only has 8 mm, and the gap G between the fan housing 110 and the casing 20 underneath the fan housing (or the mother board 20 above the fan housing) is very small, only enable an air flow F passing through a small slot. Hence, the air flow F enters the fan housing 110 through the air inlet is effected accordingly. In addition, the fan module 100 is disposed with a vane module 120, a fan motor 130 and a circuit board 140 in the fan housing 110, and as a result, the size of the vanes 122 close to the vane hub 124 must be shorted to keep away from the circuit board 140 and prevent the interference with the circuit board 140 in structure when the vane 122 is rotating. However, since the size of the vanes 122 is reduced, the capacity of the air flow F to the fan module 100 and the capacity (outlet capacity) of the air flow S exited from the fan module 100 are relatively effected so as to be reduced, thereby reducing the thermal efficiency of the fan module 100 for the electronic device.

SUMMARY OF THE INVENTION

Accordingly, the present invention is directed to a fan module for enhancing the inlet air flow capacity, outlet air flow capacity, and the thermal efficiency.

The present invention is directed to a fan module disposed in an electronic device. The fan module includes a vane module, a fan motor, a circuit board and a fan housing. The vane module has a hub and a plurality of vanes disposed around the edge of the hub. The fan motor is disposed in the hub. The circuit board is used to control the fan motor, so that the vanes rotate related to an axis of the hub for generating an air flow. The fan housing has a main body portion, a protruding portion and a fixing portion, wherein the protruding portion is located in a side of the main body portion, the vane module and the fan motor are disposed in the main body portion and the circuit board is disposed in the protruding portion.

According to an embodiment of the present invention, the fan housing is mounted on the mother board by the fixing portion, the protruding portion protrudes from the side of the main body portion's edge adjacent to the mother board and the protruding portion embeds into an opening of the mother board. Therefore, another side of the main body portion's edge adjacent to the casing can separates a gap from the casing.

According to an embodiment of the present invention, the fan module is mounted on the casing by the fixing portion, the protruding portion protrudes from the side of the main body portion adjacent to the casing, and the main body portion keeps a height difference from the casing. Another side of the main body portion's edge adjacent to the mother board separates a gap from the mother board.

According to an embodiment of the present invention, the main body portion has a hollow area, and the protruding portion is plate-shaped and has a plurality of extension arms crossing over the hollow area of the main body portion.

According to an embodiment of the present invention, the protruding portion is integrated with the main body portion and formed in the hollow area.

According to an embodiment of the present invention, the fan module further includes a wind resistant structure disposed in the hollow area.

According to an embodiment of the present invention, the fan module further includes a fan cap covering the main body portion and the fan cap has an air inlet. The air inlet is located in the axis direction of the hub.

According to an embodiment of the present invention, the fan housing has an air outlet in a radial direction of the hub.

According to an embodiment of the present invention, each of the vanes has a first width and a second width, the first width is a width of the vane far away the hub, and the second width is a width of the vane adjacent to the hub.

According to an embodiment of the present invention, the first width is equal to the second width.

Based on the above, the fan module of the present invention with a circuit board being moved out to a protruding portion from a former position in fan housing (the main body portion) so as to increase the size of the vanes adjacent to the hub and increase the inlet air flow capacity and the outlet air flow capacity of the fan module. In addition, without changing the former size between the mother board and the casing of the electronic device, a bigger gap between the fan module and the casing underneath the fan module (or the mother board above the fan module) is kept and sufficient air flow can pass therebetween to increase air flow capacity into the fan module from the air inlet. Therefore, the present invention can enhance the air flow capacity and the thermal efficiency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
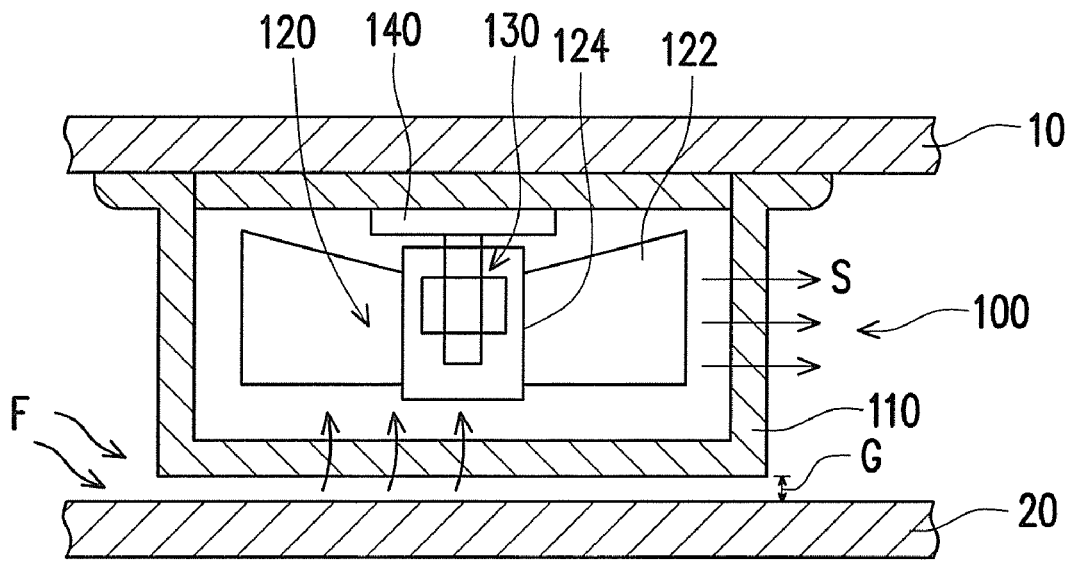
FIG. 1 is a schematic view of a conventional fan module.
Figure 2:
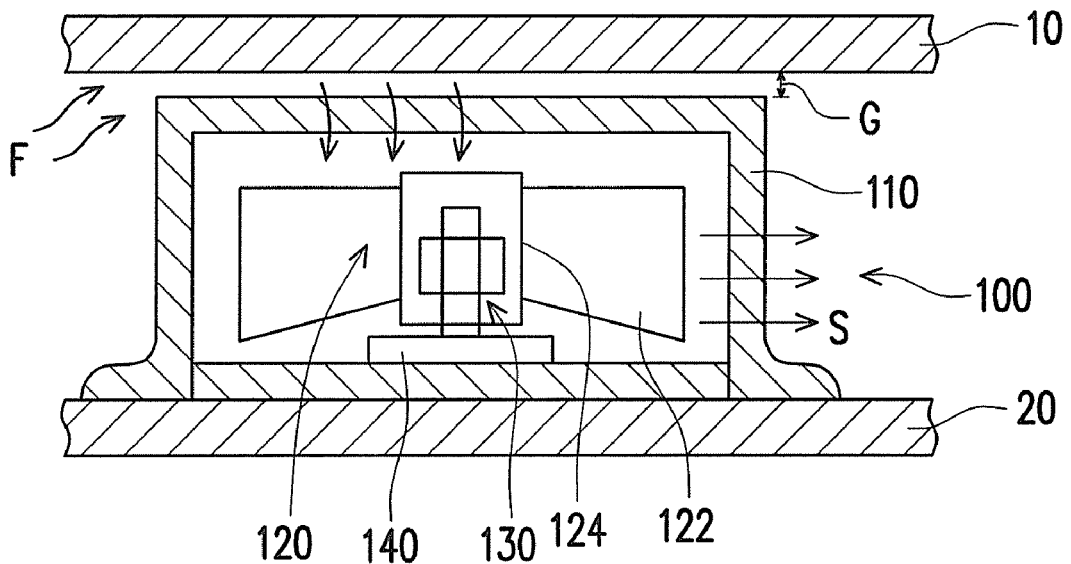
FIG. 2 is a schematic view of another conventional fan module.

Reference will now be made in detail to the present preferred embodiments of the invention, examples of which are illustrated in the accompanying drawings. Wherever possible, the same reference numbers are used in the drawings and the description to refer to the same or like parts.

The fan module in the embodiment can be applied to a heat dissipation system of an electronic device to dissipate heat from a heat-generating device in the interior of the electronic device. For example, the heat-generating device is a mother board, a central processor, a chipset, a hard disk or a memory module etc.

Figure 3:
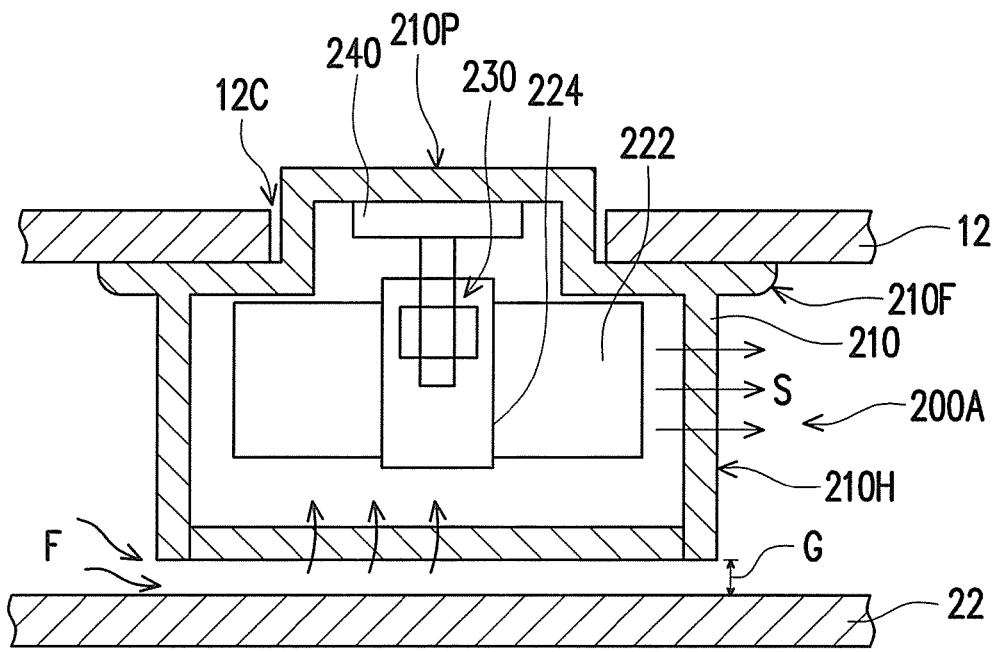
FIG. 3 is a schematic view of a fan module according to one embodiment of present invention.
Figure 4:
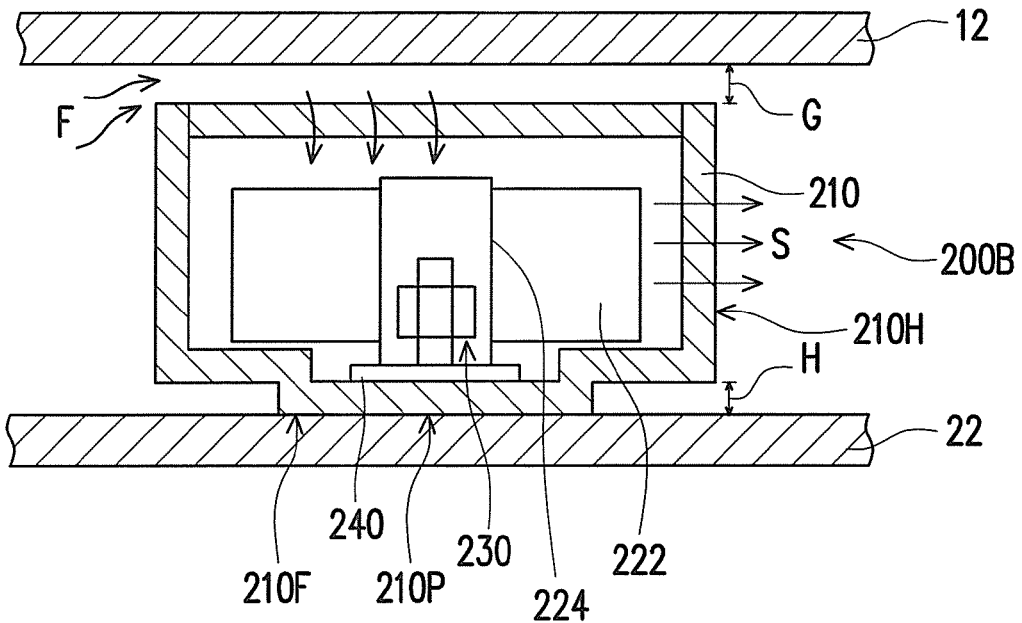
FIG. 4 is a schematic view of a fan module according to another embodiment of present invention.
Figure 5:
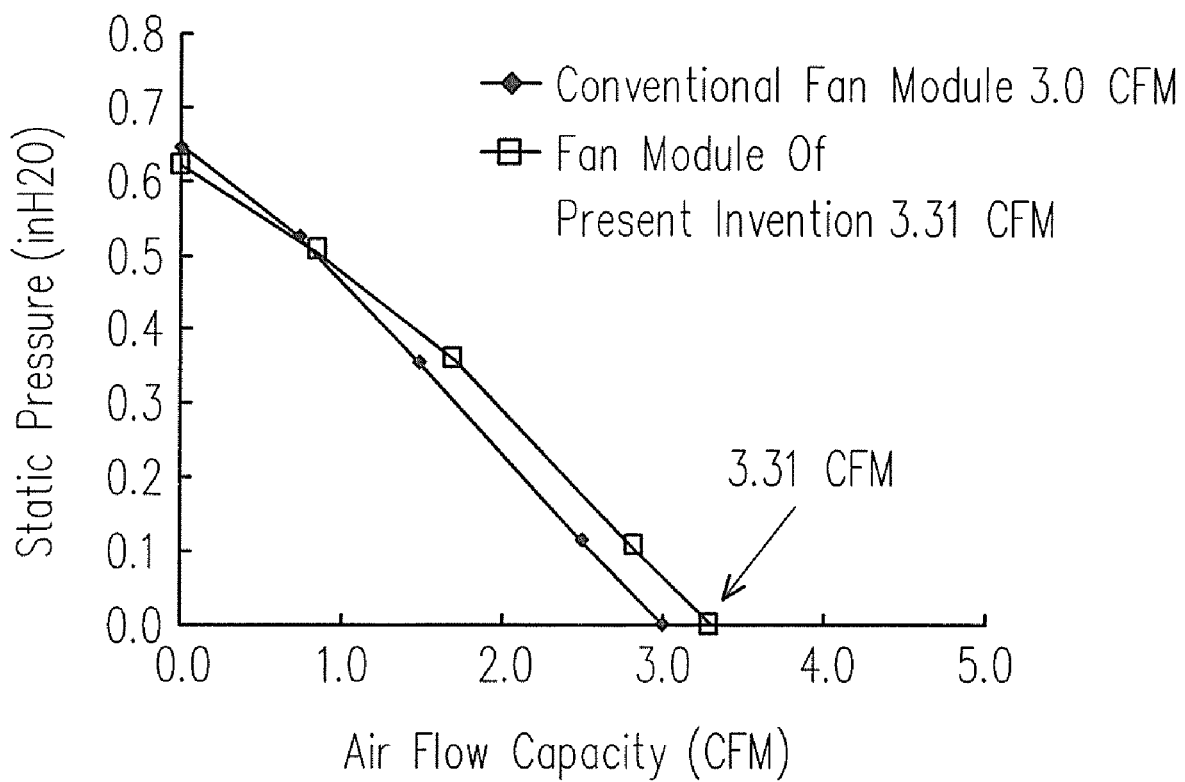
FIG. 5 is a relationship diagram of static pressure and air flow capacity of the fan module of the present invention compared with a conventional fan module.

FIG. 3 is a schematic view of a fan module according to one embodiment of the present invention. FIG. 4 is a schematic view of a fan module according to another embodiment of the present invention. Referring to the FIG. 3 at first, the fan module 200A is disposed on a mother board 12. The fan housing 210 of the fan module 200A includes a main body portion 210H, a protruding portion 210P and a fixing portion 210F. A plurality of vanes 222, a hub 224, and a fan motor 230 are disposed in the main body portion 210H, and the vanes 222 and the hub 224 become a vane module 220. The fan motor 230 is disposed in the hub 224. When the fan motor 230 is started, the vanes 222 can rotate with the hub 224 to generate a radial air flow. In addition, the protruding portion 210P protrudes from one side of the fan module's edge adjacent to the mother board 12 and located in a side of the main body portion 210H to receive the circuit board 240 therein. The circuit board 240 is electrically connected to the fan motor 230 for controlling the fan motor 230 and the fan motor 230 can rotate in a predetermined velocity to drive the vanes 222 and the hub 224 rotate. The air flow F can pass through a bigger gap G between the fan housing 210 and the casing 22 and enter the fan housing 210, then the air flow S can exit from a side of the fan housing 210 so that the inlet air flow capacity and the outlet air flow capacity of the fan module 200A is increased accordingly. The fixing portion 210F of the fan housing 210 is used to mount the fan module 200A on the mother board 12 (as shown in FIG. 3) or on the casing 22 (as shown in FIG. 4). As a design of heat-dissipation path of the electronic device, the casing 22 of the electronic device has an air inlet corresponding to the fan module 210 to provide an external air flow for the electronic device into the fan module. However, with different design of products, the casing 22 of the electronic device also does not need an air inlet corresponding to the fan module 210, it is not a restriction against the scope of the present invention. The protruding portion 210P of the fan housing 210 change its width according to different design of products, while the protruding portion 210P of the embodiment passes through an opening 12C of the mother board 12 and is exposed on anther side of the mother board 12 so that the gap G between the fan housing 210 and the casing 22 is increased.

Moreover, in FIG. 4, the fan module 200B is disposed on a casing 22. The fan housing 210 of the fan module 200B includes a main body portion 210H, a protruding portion 210P and a fixing portion 210F. The vanes 222, the hub 224, and the fan motor 230 are also disposed in the main body portion 210H. In addition, the protruding portion 210P protrudes from one side of the fan module's edge adjacent to the casing 22 and located in a side of the main body portion 210H to receive the circuit board 240 therein. The circuit board 240 is electrically connected to the fan motor 230 such that the fan motor 230 can rotate in a predetermined velocity to drive the vanes 222 and the hub 224 rotate. The air flow F can pass through the gap G between the fan housing 210 and the mother board 12 and enter the fan housing 210 so that the inlet air flow capacity and the outlet air flow capacity of the fan module 200B are increased accordingly.

It should be noted that the size design of the conventional fan module is restricted by the disposition of the circuit board and the fan vanes both being in the main body portion so that the volume of the fan vanes adjacent to the hub must be reduced to prevent the defect of interference between the fan vane and the circuit board. However, the fan module of the present invention with the circuit board 240 being moved outwards to the protruding portion 210P from a former position in the main body portion 210H of the fan housing 210 so as to increase the size of the vanes 222 adjacent to the hub 224 and increase the inlet air flow capacity and the outlet air flow capacity of the fan module. Referring to the FIG. 4 and FIG. 3, the vanes of the present invention have a first width and a second width. The first width is a width of the vane 222 far away the hub 224, while the second width is a width of the vane 222 adjacent to the hub 224. With the design of the present invention, the first width is equal to the second width to increase the size of the vane 222 adjacent to the hub 224, thereby enhancing the inlet air flow capacity and the outlet air flow capacity of the fan module. Therefore, when the fan module is mounted on the casing 22 of the electronic device, the height of the fan module is reduced for the demand of products to increase the gap G between the fan housing 210 and the mother board 12.

Comparing a relationship diagram of static pressure and air flow capacity of the fan module of the present invention with a conventional fan module, it could be known that when the static pressure is zero, it presents that the pressure in the outlet provided by the air flow driven by the fan module is equal to the atmosphere pressure. At the time, the air flow capacity per minute exited from the conventional fan module is 3.0 CFM, while the air flow capacity per minute exited from the fan module of the present invention is 3.31 CFM, which is higher than 3.0 CFM. Therefore, it is proved by experiments that the present invention can enhance the outlet air flow capacity of the fan module.

Figure 6B:
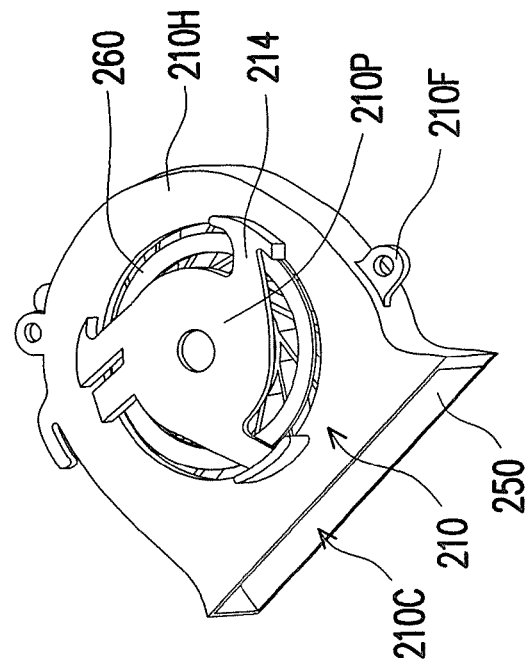
FIG. 6A and FIG. 6B are a solid schematic view and an exploded schematic view of a fan module according to one embodiment of present invention.
Figure 6A:
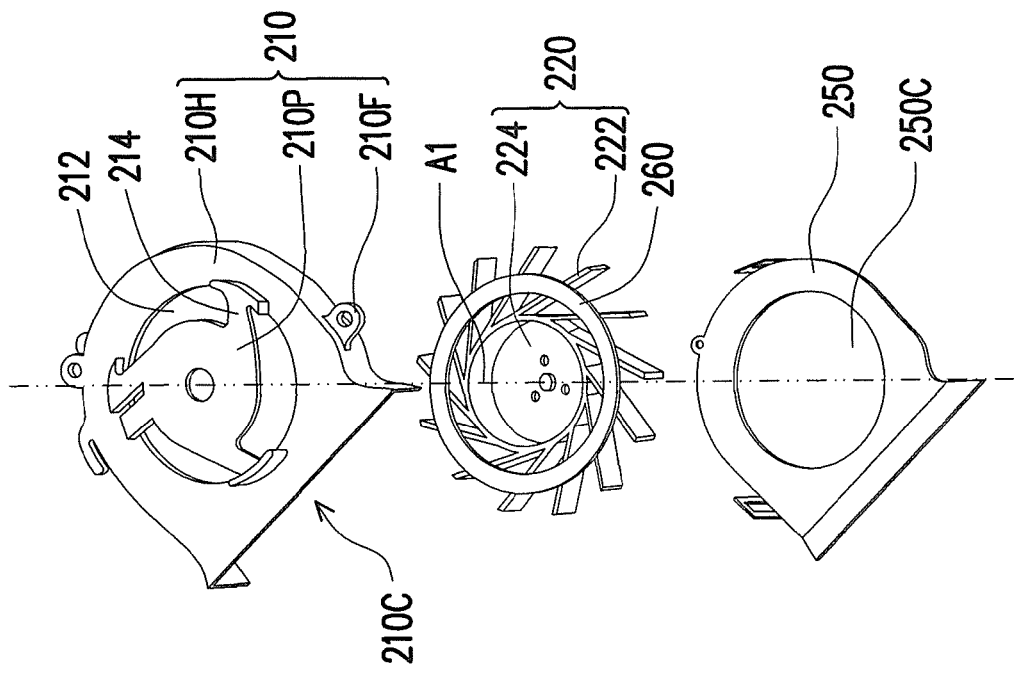

Then, FIG. 6A and FIG. 6B are a solid schematic view and an exploded schematic view of a fan module according to one embodiment of present invention. Referring to FIG. 6A, FIG. 6B, FIG. 3 and FIG. 4, the fan housing 210 includes a main body portion 210H, a protruding portion 210P and a fixing portion 210F. The vane module 220 is disposed in the main body portion 210H of the fan housing 210 and has a hub 224 and a plurality of vanes 222 disposed around the edge of the hub 224. The vanes 222 can rotate relative to an axis A1 of the hub 224 to generate a radial air flow. In the FIG. 3 of the present embodiment, when the fixing portion 210F (such as a screw hole) of the fan housing 210 is mounted on the mother board 12 by a screw (not shown), the protruding portion 210P protrudes from one side of the main body portion's edge 210H adjacent to the mother board 12 and embeds into an opening 12C of the mother board 12 so that a bigger gap G between one side of main body portion's edge 210H adjacent to the casing 22 and the casing 22 is kept, thereby increasing the air flow capacity. In addition, In the FIG. 4 of the present embodiment, when the fixing portion 210F (such as a screw hole) of the fan housing 210 is mounted on the casing 22 by a screw (not shown), the protruding portion 210P protrudes from one side of the main body portion's edge 210H adjacent to the casing 22 to keep a height difference between the casing 22 and the main body portion 210H and to keep a bigger gap G between one side of main body portion's edge 210H adjacent to the mother board 12 and the mother board 12, thereby increasing the air flow capacity.

Moreover, as shown in FIG. 6, a fan cap 250 can cover the main body portion 210H and have an air inlet 250C. The air inlet 250C is located in the axis A1 of the hub 224 so that the air flow can enter the fan housing 210 via the air inlet 250C and exit from the air outlet 210C in the radial direction of the hub 224 to cool down the internal temperature of the electronic device. The main body portion 210H, for example, has a hollow area 212, and the protruding portion 210P is a plate-shaped and has a plurality of extension arms 214 crossing over the hollow area 212 of the main body portion 210H. Next, a wind resistant structure 260 can be disposed in the hollow area 212, such as a ring plate, which resists the air flow leakage from the hollow area 212. Therefore, the decrease of the air flow capacity due to the defect of leakage from the hollow area 212 can be presented when the fan vanes rotate at high velocity. With the different design of the products, the wind resistant structure 260 can contact with the vane module 220 and be put in the hollow area 212 to prevent the defect of leakage when the fan module is operated.

In overview, the fan module of the present invention with a circuit board being moved out to a protruding portion from a former position in fan housing (the main body portion) so as to increase the size of the vanes adjacent to the hub and increase the inlet air flow capacity and the outlet air flow capacity of the fan module. In addition, without changing the former size between the mother board and the casing of the electronic device, a bigger gap between the fan module and the casing underneath the fan module (or the mother board above the fan module) is kept and sufficient air flow can pass therebetween to increase air flow capacity into the fan module from the air inlet. Therefore, the present invention can enhance the air flow capacity and the thermal efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fan module disposed in an electronic device having a mother board and a casing, the fan module comprising:
   a vane module having a hub and a plurality of vanes, wherein the vanes are disposed around the edge of the hub;
   a fan motor disposed in the hub;
   a circuit board connected to the fan motor for controlling the fan motor to rotate the vanes relative to an axis of the hub to generate an air flow; and
   a fan housing having a main body portion, a protruding portion and a fixing portion, wherein the protruding portion is located in a side of the main body portion, the vane module and the fan motor are disposed in the main body portion, the circuit board is disposed in the protruding portion, the fan housing is mounted on the mother board by the fixing portion, the protruding portion protrudes from the side of the main body portion's edge adjacent to the mother board and the protruding portion embeds into an opening of the mother board.

2. The fan module according to claim 1, wherein another side of the main body portion's edge adjacent to the casing separates a gap from the casing.

3. The fan module according to claim 1, wherein the main body portion has a hollow area, and the protruding portion is a plate-shaped and has a plurality of extension arms crossing over the hollow area of the main body portion.

4. The fan module according to claim 3, wherein the protruding portion is integrated with the main body portion and formed in the hollow area.

5. The fan module according to claim 3, further comprising a wind resistant structure disposed in the hollow area.

6. The fan module according to claim 1, further comprising a fan cap covering the main body portion and the fan cap having an air inlet.

7. The fan module according to claim 6, wherein the air inlet is located in the axis direction of the hub.

8. The fan module according to claim 1, wherein the fan housing has an air outlet in a radial direction of the hub.

9. The fan module according to claim 1, wherein each of the vanes has a first width and a second width, the first width is a width of the vane far away the hub, and the second width is a width of the vane adjacent to the hub.

10. The fan module according to claim 9, wherein the first width is equal to the second width to enhance inlet air flow capacity and outlet air flow capacity of the fan module.

11. A fan module disposed in an electronic device having a mother board and a casing, the fan module comprising:
    a vane module having a hub and a plurality of vanes, wherein the vanes are disposed around the edge of the hub;
    a fan motor disposed in the hub;
    a circuit board connected to the fan motor for controlling the fan motor to rotate the vanes relative to an axis of the hub to generate an air flow; and
    a fan housing having a main body portion, a protruding portion and a fixing portion, wherein the protruding portion is located in a side of the main body portion, the vane module and the fan motor are disposed in the main body portion, the circuit board is disposed in the protruding portion, the fan module is mounted on the casing by the fixing portion, the protruding portion protrudes from the side of the main body portion adjacent to the casing, and the main body portion keeps a height difference from the casing.

12. The fan module according to claim 11, wherein another side of the main body portion's edge adjacent to the mother board separates a gap from the mother board.

13. The fan module according to claim 11, wherein the main body portion has a hollow area, and the protruding portion is a plate-shaped and has a plurality of extension arms crossing over the hollow area of the main body portion.

14. The fan module according to claim 13, wherein the protruding portion is integrated with the main body portion and formed in the hollow area.

15. The fan module according to claim 13, further comprising a wind resistant structure disposed in the hollow area.

16. The fan module according to claim 11, further comprising a fan cap covering the main body portion and the fan cap having an air inlet.

* * * * *

UNITED STATES PATENT AND TRADEMARK OFFICE
CERTIFICATE OF CORRECTION

PATENT NO.      : 8,014,149 B2                                       Page 1 of 1
APPLICATION NO. : 12/607957
DATED           : September 6, 2011
INVENTOR(S)     : Ifeng Hsu et al.

It is certified that error appears in the above-identified patent and that said Letters Patent is hereby corrected as shown below:

On the cover page item (22) should read as follows:

(22) Filed: October 28, 2009

Signed and Sealed this
Sixth Day of December, 2011

David J. Kappos
*Director of the United States Patent and Trademark Office*